United States Patent
Nakagawa et al.

(10) Patent No.: US 6,588,927 B2
(45) Date of Patent: Jul. 8, 2003

(54) PURIFIED DEVELOPER PRODUCING EQUIPMENT AND METHOD

(75) Inventors: Toshimoto Nakagawa, Kawasaki (JP); Shu Ogawa, Tokyo (JP); Satoru Morita, Tokyo (JP); Makoto Kikukawa, Yokohama (JP); Takahiro Hozan, Tatsuno (JP)

(73) Assignee: Nagase & Co., Ltd., Osaka (JP)

( * ) Notice: Subject to any disclaimer, the term of this patent is extended or adjusted under 35 U.S.C. 154(b) by 19 days.

(21) Appl. No.: 10/068,810

(22) Filed: Feb. 6, 2002

(65) Prior Publication Data

US 2002/0136087 A1 Sep. 26, 2002

(30) Foreign Application Priority Data

Feb. 6, 2001 (JP) ........................................ 2001-029295

(51) Int. Cl.[7] ................................................ B01F 15/02
(52) U.S. Cl. ................................ 366/152.3; 366/152.4; 366/153.1; 366/160.1
(58) Field of Search .......................... 366/152.4, 152.6, 366/152.2, 152.1, 153.1, 160.1

(56) References Cited

U.S. PATENT DOCUMENTS

| | | | | |
|---|---|---|---|---|
| 3,977,682 A | * | 8/1976 | Aida ........................... | 273/237 |
| 4,103,358 A | * | 7/1978 | Gacki et al. ............... | 366/153.1 |
| 4,165,186 A | * | 8/1979 | Tortorich et al. .......... | 366/153.1 |
| 4,197,942 A | * | 4/1980 | Gacki et al. ............... | 366/153.1 |
| 4,217,054 A | * | 8/1980 | Gacki et al. ............... | 366/152.2 |
| RE30,610 E | * | 5/1981 | Gacki et al. ............... | 366/153.1 |
| 4,312,595 A | * | 1/1982 | Houseman et al. ....... | 366/153.1 |
| 5,476,320 A | * | 12/1995 | Taguchi et al. ........... | 366/152.1 |
| 5,511,876 A | * | 4/1996 | Plessers et al. ........... | 366/153.1 |
| 5,632,960 A | * | 5/1997 | Ferri et al. ................. | 366/152.2 |
| 5,874,049 A | * | 2/1999 | Ferri et al. ................. | 366/152.1 |
| 5,924,794 A | * | 7/1999 | O'Dougherty et al. ... | 366/152.1 |

FOREIGN PATENT DOCUMENTS

JP          2751849          2/1998

OTHER PUBLICATIONS

Patent Abstracts of Japan, Publication No. 08–062852, Date of Publication of Application Mar. 08, 1996, 2 pages.

* cited by examiner

Primary Examiner—Tony G. Soohoo
(74) Attorney, Agent, or Firm—Rosenthal & Osha L.L.P.

(57) ABSTRACT

The developer producing equipment of the present invention is equipped with a preparation tank to which a developer stock solution and pure water are supplied, and in which these ingredients are agitated, and a leveling tank which is connected to this preparation tank. The leveling tank is connected via piping to working equipment in which electronic circuits are formed. Furthermore, the preparation tank and leveling tank have first and second alkali concentration measuring means for measuring the alkali concentrations of the alkali type developer inside the respective tanks. In the preparation tank, either the amount of developer stock solution that is supplied to the tank or the amount of pure water that is supplied to the tank, or both, are adjusted on the basis of the measured value obtained by the first alkali concentration measuring means, so that an alkali type developer is prepared. This alkali type developer is fed into the leveling tank, where the alkali concentration is evened out, after which the alkali type developer is fed into the working equipment via piping.

15 Claims, 3 Drawing Sheets

PURIFIED DEVELOPER PRODUCING EQUIPMENT AND METHOD

BACKGROUND OF THE INVENTION

1. Field of the Invention

The present invention relates to developer producing equipment and a developer producing method, and more particularly to equipment which is connected via piping to working equipment in which electronic circuits on which fine working is performed are formed, and which manufactures an alkali type developer that is used to develop photoresists or the like in the abovementioned working equipment, and a method for manufacturing this alkali type developer.

2. Description of the Related Art

Generally, resist materials used in photolithographic processes in the manufacture of devices such as electronic devices or the like that have electronic circuits on which fine working is performed include positive type materials that are solubilized by exposure to light, and negative type materials that are insolubilized by exposure to light. As one example, in the manufacture of semiconductor devices, flat panel display (FPD) substrates and the like, such photo-etching is repeatedly performed; accordingly, mainly positive type resists are commonly used.

Aqueous solutions of inorganic alkalies consisting of sodium phosphate, caustic soda, sodium silicate or mixtures of these substances with other inorganic alkalies or the like may be cited as examples of developer materials for positive type resists. Furthermore, in cases where contamination by alkali metals is a concern, aqueous solutions of amine type organic alkalies that contain no metals, aqueous solutions of tetramethylammonium hydroxide (TMAH), aqueous solutions of trimethylmonoethanolammonium hydroxide (choline) or the like are used. Among the latter materials, an aqueous solution of TMAH with a concentration of 2.38% are widely used.

Furthermore, developers prepared from these materials are used in large quantities in developing devices using a spray system, spin-coating system, dipping system or the like.

In developers used on photo-resists, the composition and concentration of the developer must be strictly controlled in order to obtain the maximum resolution, patterning sharpness (sharpness), stability and high yield in accordance with the developing process.

In particular, as the density of patterning has increased in recent years, there has been a demand for finer patterning widths. For example, in the case of semiconductor substrates, a demand has appeared for line widths on the 0.1 $\mu$m level; furthermore, in the case of flat panel display substrates, there is now a demand for line widths on the 1 $\mu$m level, and in the case of multi-layer printed circuit boards, there is a demand for line widths on the 10 $\mu$m level. Furthermore, there is now a demand for line widths of 1 $\mu$m or less in order to incorporate semiconductor circuits into flat panel display substrates using low-temperature polycrystalline silicon TFT techniques.

Consequently, there is a strong demand for improved precision of developer concentrations in order to reduce the variation in the effective sensitivity of photo-resists. For example, a range of values that deviate from the specified concentration by $\pm\frac{1}{1000}$ or less is required as the control range of the developer concentration. Especially in the case of an aqueous solution of TMAH, a range of values that deviate from the specified concentration by $\pm\frac{1}{2000}$ or less (more concretely, 2.380$\pm$0.001 wt %) is required.

Furthermore, in order to eliminate patterning defects, it is required that various developers contain extremely few particles, i.e., the content of particles with a size of 0.1 $\mu$m or greater must be 10 or fewer particles per milliliter of developer.

In recent years, moreover, there has been a further increase in the amount of developer used as a result of increased size and increased mass production of substrates.

Thus, along with a sharp demand for improved precision in developer concentrations and demand for particle-free developers, there has been a strong demand for measures to facilitate mass production and reduce cost.

In the case of conventional techniques, however, adjustment of the composition and concentration of developers in manufacturing plants for semiconductor devices and the like has been extremely difficult, not only in terms of equipment and operating costs, but also from the standpoint of sufficient control the of the composition and concentration of the developers.

For these reasons, it has been unavoidable necessary in manufacturing plants for semiconductor devices and the like (hereafter referred to as the "use side") to use developers whose composition and concentration have been adjusted exclusively by the developer makers (hereafter referred to as the "supply side").

In such cases, a method is used in which a developer stock solution that has been prepared with a specified composition is diluted with pure water on the supply side, the developer thus adjusted to a specified concentration is places in containers, and this adjusted developer is supplied to the use side.

In this case, the dilution factor of the developer stock solution varies according to the solution composition and stock solution concentration, the type of positive resist or the like that is the object of development, and the intended use. Ordinarily, the stock solution is diluted approximately 8 to 40 times. Accordingly, the amount of developer prepared on the supply side is greatly increased in accordance with the dilution factor, thus resulting in an increase in the work involved in preparing containers and filling containers for the shipping of the developer to the use side, and an increase in shipping costs. As a result, such expenses account for a considerable portion of the cost of the developer.

Furthermore, considerable time is required for shipping and storage until the developer prepared on the supply side can be used on the use side, and the developer deteriorates during this period.

Moreover, since developers tend to absorb carbon dioxide gas from the air, variations in concentration caused by the absorption of carbon dioxide gas occur during the dilution operation and during the storage of the diluted developer, even if a dilution apparatus is installed on the use side. This may also be cited as one of the reasons why the dilution of developers has not been performed on the use side in semiconductor device manufacturing plants or the like.

In order to solve these problems, a developer dilution apparatus comprising an agitating tank into which a photoresist alkali type developer stock solution and pure water are introduced and subjected to forced agitation for a specified period of time, conductivity measuring means for extracting a portion of the mixed solution in the agitating tank, measuring the conductivity of this solution and then returning the solution of the agitating tank, control means for controlling either the photo-resist alkali type developer stock solution or pure water that is supplied to the agitating tank on the basis of the output signal from the conductivity measuring means, a storage tank into which the mixed solution from the agitating tank is introduced, and in which this mixed solution is stored, and nitrogen gas sealing means for sealing the agitating tank and storage tank with nitrogen gas, is disclosed in Japanese Patent No. 2751849. Furthermore, this apparatus makes it possible to prepare the developer on the use side by mixing the developer stock solution and pure water.

SUMMARY OF THE INVENTION

However, when the present inventors investigated the abovementioned conventional apparatus in detail in the light of requirements arising in the manufacture of electronic circuit boards for semiconductor devices and the like, which have become progressively finer and thinner, it became clear that the precision of the alkali concentration and the particle concentration in the developer obtained are not always satisfactory, and that there is a strong demand for improved quality in terms of high precision and particle-free solutions.

Accordingly, the present invention was devised in light of the abovementioned facts; it is an object of the present invention to provide purified developer producing equipment and a purified developer producing method which make it possible to produce a developer with a specified concentration quickly and with good precision from a developer stock solution on the use side, and which make it possible to control the composition and concentration of the developer thus produced with good precision.

In order to solve the abovementioned problems, the purified developer producing equipment of the present invention is equipment which is connected via piping to working equipment in which electronic circuits on which fine working is performed are formed, and which manufactures an alkali type developer that is used to develop photoresists or the like in the abovementioned working equipment, this purified developer producing equipment of the present invention comprising a preparation tank to which a developer stock solution and pure water are supplied, and in which an alkali type developer is prepared, first alkali concentration measuring means for measuring the alkali concentration of the alkali type developer in the preparation tank, liquid supply control means for controlling at least the amount of developer stock solution that is supplied to the preparation tank or the amount of pure water that is supplied to the preparation tank, or both, on the basis of the measured value obtained by the first alkali concentration measuring means, a leveling (concentration-evening) tank to which the alkali type developer from the preparation tank is supplied, and which evens out the alkali concentration of this alkali type developer, and liquid feed/liquid surface level control means for feeding the alkali type developer from the preparation tank into the leveling tank, and adjusting the liquid surface level of the alkali type developer in the preparation tank and the liquid surface level of the alkali type developer in the leveling tank.

In the developer producing equipment constructed in this manner, the developer stock solution is diluted with pure water in the preparation tank so that a diluted developer is prepared. In this case, the concentration of the alkali constituting the developer component in the preparation tank is actually measured, and the liquidity is adjusted by the liquid supply control means on the basis of this measurement so that the developer has the desired concentration. Accordingly, the concentration can be adjusted quickly and easily, and concentration control can be accomplished with good precision.

Furthermore, the alkali developer that is obtained in the preparation tank inevitably tends to have a slight error in the alkali concentration. Accordingly, in the present invention, the alkali developer in the preparation tank is fed into a leveling tank, and the alkali concentration is evened out in this leveling tank. As a result, the precision of the alkali concentration in the developer is greatly improved.

Furthermore, since the developer thus prepared with the desired concentration can be supplied to working equipment via piping, separate storage or shipping costs are eliminated. Moreover, if the developer preparation apparatus including the piping connected to the working equipment is constructed as a system that is substantially sealed off from the atmosphere, deterioration of the developer caused by the absorption of carbon dioxide gas and the like in the atmosphere by the developer can be suppressed.

Furthermore, in the present equipment, the respective liquid surface levels in the preparation tank and leveling tank can be adjusted to any desired levels by the liquid feed/liquid surface level control means. In this case, it is desirable that the liquid feed/liquid surface level control means be means which are such that the alkali type developer is naturally fed from the preparation tank to the leveling tank, with such means having a communicating pipe that is connected to the preparation tank and leveling tank. As a result, both liquid surface levels are adjusted to substantially the same level by the hydraulic pressure difference, and disturbance of the liquid flow and the admixture of foreign matter can be effectively suppressed in this case.

In concrete terms, it is desirable that the leveling tank be equipped with second alkali concentration measuring means for measuring the alkali concentration of the alkali type developer in the leveling tank.

More concretely, the leveling tank is equipped with an agitation mechanism that agitates the alkali type developer in the leveling tank.

Even more concretely, the leveling tank is equipped with a filtration mechanism that filters the alkali type developer in the leveling tank.

Furthermore, it is desirable that circulation feeding (feedback) piping that feeds (refluxes) the alkali type developer in the leveling tank into the preparation tank be provided.

Moreover, it is desirable that a storage tank which is disposed between the leveling tank and the working equipment, and which stores the alkali type developer, be provided.

Furthermore, a system which has a plurality of preparation tanks is also useful.

Alternatively, the preparation tank and leveling tank may also be constructed as an integral unit.

In addition, it is ideal if wet nitrogen gas sealing means that seal the preparation tank and leveling tank with wet nitrogen gas are provided.

Even more preferably, solute gas removal means that remove the solute gas contained in the alkali type developer are provided.

Furthermore, it is even more useful if fine particle number measuring means that measure the number of fine particles contained in the alkali type developer in the state prior to the supply of the alkali type developer to the working equipment are provided.

It is especially desirable that the first alkali concentration measuring means consist of at least one of the following devices: namely, a conductivity meter, and ultrasonic concentration meter, a liquid density meter or an automatic titration device.

Similarly, it is desirable that the second alkali concentration measuring means consist of at least one of the following devices: namely, a conductivity meter, and ultrasonic concentration meter, a liquid density meter or an automatic titration device.

Furthermore, the purified developer producing method of the present invention is a method that produces an alkali type developer that is supplied via piping to a working process that forms electronic circuits on which fine working is performed, this producing method comprising the steps of preparing an alkali type developer by agitating a developer stock solution and pure water, measuring the alkali concentration of the alkali type developer, adjusting either the amount of developer stock solution that is supplied to the alkali type developer preparation step or the amount of pure water that is supplied to the alkali type developer preparation step, or both, on the basis of the measured value of the alkali concentration of the alkali type developer, evening out the concentration of the alkali type developer obtained in the alkali type developer preparation step, and adjusting the liquid surface level of the alkali type developer in the alkali type developer preparation step and the liquid surface level of the alkali type developer in the alkali type developer leveling step.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
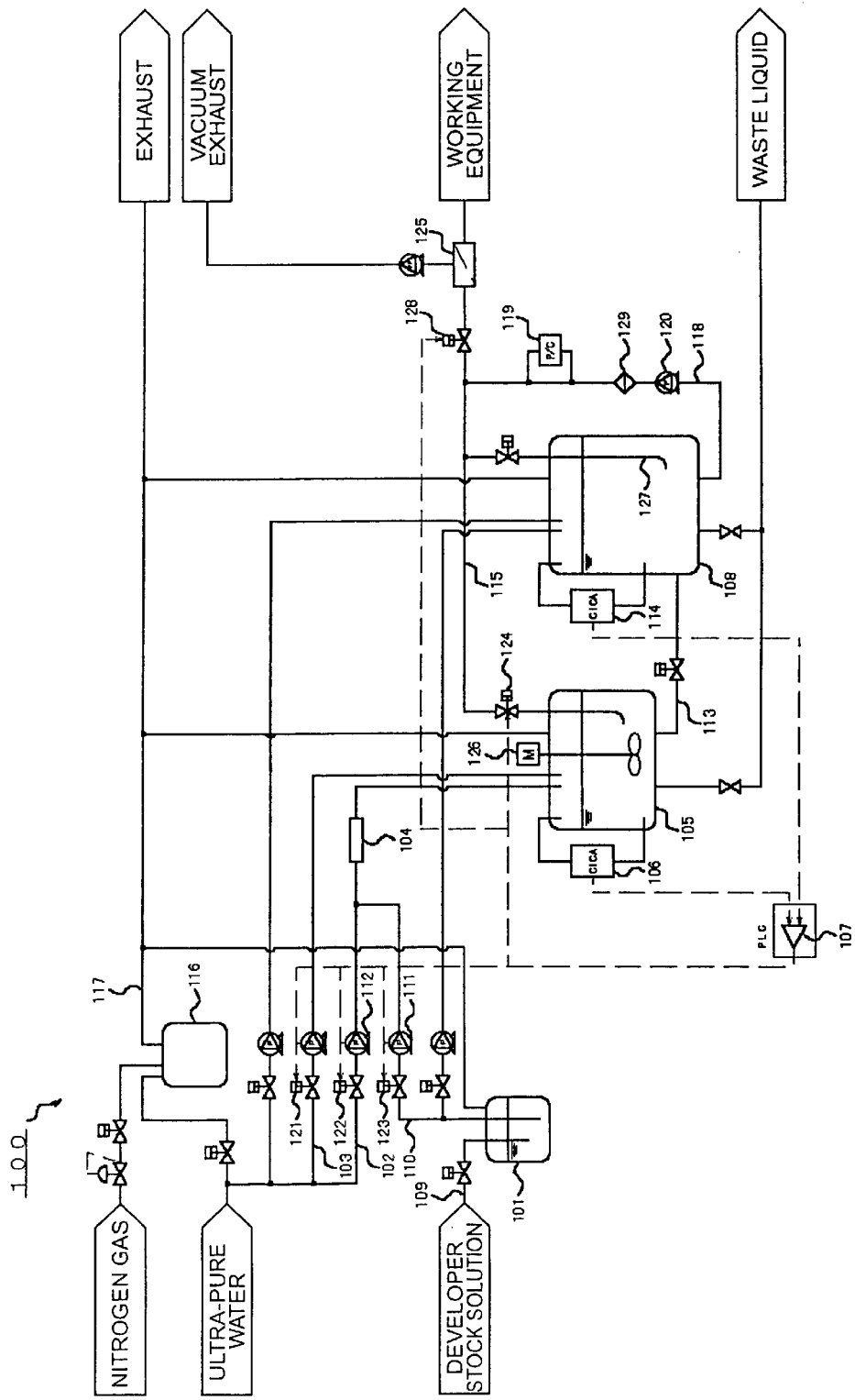
FIG. 1 is a system diagram which shows the construction of a first embodiment of the developer producing equipment of the present invention in model form.

Embodiments of the present invention will be described in detail below. Furthermore, the same elements are labeled with the same symbols, and redundant descriptions are omitted. Moreover, unless otherwise specifically noted, the positional relationships are based on the positional relationships shown in the figures. In addition, the dimensional proportions of the figures are not limited to the proportions shown in the figures.

As was described above, FIG. 1 is a system diagram which shows the construction of a first embodiment of the developer producing equipment of the present invention in model form.

The purified developer producing equipment 100 is equipped with a developer stock solution tank 101 in which a developer stock solution is stored, and a preparation tank 105 to which a pure water supply system is connected, and is also equipped with a leveling tank 108 which is connected to this preparation tank 105. A developer stock solution is stored in the developer stock solution tank 101, and the system is arranged so that the developer stock solution is replenished in the developer stock solution tank 101 via piping 109 which has a flow rate regulating valve on the basis of command values from a liquid level gauge not shown in the figures.

Furthermore, piping 110 which has a flow rate regulating valve 123 and a pump 111 is connected to the developer stock solution tank 101. This piping 110 is connected to pure water supply piping 102 which has a line mixer 104 and which is connected to the pure water supply system, with this connection of the piping 110 being located on the upstream side of the line mixer 104. As a result of the operation of the pump 111, the developer stock solution in the developer stock solution tank 101 flows from the piping 110, flows together with pure water supplied by the operation of the pump 112 inside the pure water supply piping 102 (which has a flow rate regulating valve 122 and pump 112), and is further mixed by the line mixer 104, after which this mixture is fed into the preparation tank 105.

Furthermore, pure water supply piping 103 which has a flow rate regulating valve 121 and a pump, and which is connected to the preparation tank 105, branches from the pure water supply piping 102, and is arranged so that pure water can be supplied alone to the preparation tank 105.

Here, examples of the developer stock solution used in the present invention include aqueous solutions of inorganic alkalies such as sodium phosphate, caustic soda, sodium silicate or mixtures of these compounds with other inorganic alkalies or the like. Furthermore, in cases where contamination by alkali metals is a concern, a organic metal-free amine type alkali aqueous solution, aqueous solution of TMAH, aqueous solution of choline or the like is useful.

Meanwhile, the pure water used in the present invention may be pure water that is used in circuit board manufacturing plants or the like in which alkali type developers are required. In such manufacturing plants or the like, large quantities of pure water are required; accordingly, a pure water manufacturing apparatus tends to be viewed as a necessary piece of equipment. Consequently, pure water for the manufacture of the alkali type developer required in the present invention is relatively easy to obtain on the supply side.

Furthermore, additives may be appropriately added to the alkali type developer as required. Examples of such additives include surfactants and the like. Furthermore, in cases where additives are added, additive tanks may also be installed.

Furthermore, the preparation tank 105 is equipped with agitating means 126 (an agitation mechanism), and has alkali concentration measuring means 106 (first alkali concentration measuring means) that are connected to a control system which has liquid supply control means 107.

The agitating means 126 are used to forcibly agitate the mixed solution consisting of the developer stock solution and pure water that fed from the line mixer 104. Here, the method that is used to agitate the mixed solution is (for example) agitation by means of agitating vanes or circulation type agitation in which the mixed solution is cause to circulate (reflux) through the preparation tank 105. Furthermore, in the case of circulation type agitation, if the discharge direction of the nozzle that is used to discharge the circulating liquid again into the preparation tank 105 is disposed so that the mixed solution rotates in the direction of the inner circumference of the preparation tank 105, a jet stream rotation type agitating action can be performed. The agitating means 126 are means that can realize one of the abovementioned agitation methods.

Furthermore, the alkali concentration measuring means 106 are means that are used to measure and control the alkali concentration of the alkali type developer in the preparation tank 105. Examples of such alkali concentration measuring means 106 include a conductivity meter, an ultrasonic concentration meter, and liquid density meter and an automatic titration device or the like.

Any of these devices may be used; however, the use of a conductivity meter is especially desirable. In this case, if the relationship between the conductivity of the alkali type developer and the concentration of the alkali type developer at a preset reference temperature and the temperature coefficient of the conductivity of the alkali type developer in the vicinity of the reference temperature are determined, a developer with a desired concentration can be manufactured easily and with good precision.

Furthermore, the alkali concentration measuring means 106 may also be installed outside the preparation tank 105 as shown in FIG. 1, and it is desirable that the measuring means 106 be installed so that the electrode parts are disposed inside the preparation tank 105, thus allowing direct measurement of the alkali concentration of the alkali type developer inside the preparation tank 105.

Furthermore, the liquid supply control means 107 are means that control either the amount of developer stock solution that is supplied to the preparation tank 105 or the amount of pure water that is supplied to the preparation tank 105, or both, on the basis of the measurement signal from the alkali concentration measuring means 106. In concrete terms, these liquid supply control means 107 control either the amount of developer stock solution that is supplied to the preparation tank 105 or the amount of pure water that is supplied to the preparation tank 105, or both, at the time of the initial preparation of the alkali type developer, and at the time of re-preparation of the alkali type developer when the supply of alkali type developer has diminished as a result of use. Furthermore, the liquid supply control means 107 are connected to flow rate regulating valves 121, 122 and 123.

Meanwhile, the leveling tank 108 is connected to the preparation tank 105 via piping 113 in which a flow rate regulating valve is installed, and via piping 115 (circulation and feeding piping) which is connected to piping 118, and which has a flow rate regulating valve 124, and the leveling tank 108 is connected to the working equipment by the piping 118. This piping 118 has a pump 120, a filter 129 (filtration mechanism), particle number measuring means 119, a flow rate regulating valve 128 and solute gas removal means 125. Furthermore, the flow rate regulating valves 124 and 128 are connected to the abovementioned liquid supply control means 107.

The filter 192 which is installed after the pump 120 in the piping 118 is used to remove the particle components that are admixed with the alkali type developer. Specifically, there is a possibility that particles originating in the driving of the pump 120 or piping system, particle originating in the developer stock solution and particles originating in dust (inorganic substances or organic substances) from outside the apparatus or the like may be admixed with the alkali type developer that is fed in from the leveling tank 108.

Such particles in the alkali type developer may cause developing problems during the development of electronic circuit boards or the like in the working equipment. If this happens, there is a danger that patterning defects or the like may occur. Accordingly, in the case of alkali type developers that are used in developing processes for electronic circuit boards, it is usually required that the number of particles with a diameter of 0.1 $\mu$m or greater be subject to a limit (control value) of 10 or fewer particles per milliliter of alkali type developer. Consequently, a material with a filtration function that can handle such a standard is appropriately selected as the filter material of the filter 129; examples of materials that can be used include woven and nonwoven fabrics, and filtration membranes.

Furthermore, the particle number measuring means 119 installed after the filter 129 are means that are used in order to measure the number of particles contained in the alkali type developer. As was described above, most of the particles contained in the alkali type developer that is fed from the leveling tank 108 can be removed by the filter 129. The particle number measuring means 119 are used to judge whether or not the particle concentration in the alkali type developer that is thus filter satisfies the control value.

Here, any alkali type developer that contains particles exceeding the specified control value even after passing through the filter 129 is fed into the leveling tank 108 via the piping 115, and is again filtered by the filter 129 via the piping 118. As a result, the particle concentration in the alkali type developer can be securely suppressed to a fixed value or less.

Moreover, the solute gas removal means 125 installed after the flow rate regulating valve 128 are used to remove solute gases from the alkali type developer in the pre-stage located before the working equipment.

Generally, gases such as oxygen gas, nitrogen gas and the like may dissolve in the alkali type developer. When such gases are dissolved in the alkali type developer, gas bubbles may be generated when the alkali type developer is used in an electronic circuit board manufacturing process, so that the developing function of the developer tends to drop. Accordingly, it is desirable that such solute gases be removed by the solute gas removal means 125.

Here, there are no particular restrictions on the solute gas removal means 125, as long as these means are capable of removing solute gases present in the alkali type developer. For example, a device that vaporizes solute gases in the solution using a vacuum effect, or a degassing device using a gas-liquid separating membrane may be used.

Furthermore, alkali concentration measuring means 114 (second alkali concentration measuring means) similar to the alkali concentration measuring means 106 are disposed in the leveling tank 108. The alkali concentration measuring means 114 are connected to the abovementioned liquid supply control means 107.

Furthermore, the leveling tank 108 is respectively connected to the developer stock solution tank 101 and pure water supply system via piping which branches from the piping 110 and pure water supply piping 102, and which has a flow rate regulating valve and pump.

Moreover, wet nitrogen gas sealing means 116 to which nitrogen gas and pure water are supplied are connected to the preparation tank 105 and leveling tank 108 via piping 117. Similarly, the developer stock solution tank 101 is also connected to the wet nitrogen gas sealing means 116 by a branch pipe from the piping 117.

As was described above, when the alkali type developer contacts the outside air (atmosphere), the alkali type developer absorbs and reacts with oxygen gas, carbon dioxide gas and the like contained in the air, so that the alkali type developer may show a deterioration in properties (liquidity). On the other hand, dry nitrogen gas does not undergo any substantial reaction with the alkali type developer. However, if dry nitrogen gas and the alkali type developer come into contact with each other, the moisture in the alkali type developer evaporates, leading to a rise in the alkali concentration of the solution.

On the other hand, the interiors of the preparation tank 105 and leveling tank 108 which are connected to the wet nitrogen gas sealing means 116 in which wet nitrogen gas is obtained are sealed by wet nitrogen gas via the piping 117; accordingly, the abovementioned deterioration in the liquidity of the alkali type developer and rise in the alkali concentration are effectively prevented. Furthermore, since the developer stock solution tank 101 is also similarly sealed by wet nitrogen gas, deterioration in the liquidity of the developer stock solution and a rise in the alkali concentration of this solution are effectively prevented.

Here, in regard to the concrete conditions of the wet nitrogen gas, the pressure of this gas may be maintained at (for example) approximately 100 to 200 mmAq.

On example of the purified developer producing method of the present invention using the purified developer producing equipment 100 constructed as described above will be described below.

First, during the preparation of the solution in the empty preparation tank 105, a liquid level gauge (not shown in the figures) detects that the preparation tank 105 is "empty". Afterward, the pump 111 and pump 112 are operated by command signals from this liquid level gauge, so that a mixed solution consisting of the developer stock solution and pure water is fed into the preparation tank 105. Next, this mixed solution is agitated by the agitating means 126, so that the alkali concentration in this state is roughly evened out. At the same time, the alkali concentration of the mixed solution is measured by the alkali concentration measuring means 106.

A signal indicating the measured value of this alkali concentration is output from the alkali concentration measuring means 106, and this signal is input into the liquid supply control means 107. On this basis of this measurement signal, the liquid supply control means 107 perform calculations that calculate the amount of developer stock solution and/or pure water that is to be supplied to the preparation tank 105 in order to prepare the alkali type developer of the desired concentration.

Next, a signal indicating the results of these calculations is sent from the liquid supply control means 107 to at least one of the flow rate regulating valves 121, 122 and 123, and the specified flow rate regulating valve(s) are opened for a fixed time at a specified degree of opening in accordance with this command. As a result, a specified amount of developer stock solution or pure water (or both) is supplied to the preparation tank 150, and an alkali type developer having the desired concentration is prepared.

In this way, an alkali type developer is prepared in the preparation tank 105 by a continuous system or batch system. Next, this alkali type developer is fed into the leveling tank 108 via the piping 113. In the alkali type developer prepared in the preparation tank 105, the alkali concentration of the developer is controlled by the alkali concentration measuring means 106; however, some error with respect to the desired concentration is unavoidably generated in each preparation. The leveling tank 108 is used to achieve much more accurate and precise control of the alkali concentration by minimizing this error.

In concrete terms, in cases where the alkali concentration of the alkali type developer in the leveling tank 108 is found to differ from the desired concentration by an amount exceeding the permissible amount of error as a result of measurement by the alkali concentration measuring means 114, the alkali type developer in the leveling tank 108 is fed into the preparation tank again via the piping 115. The alkali concentration of the alkali type developer that is thus fed back into the preparation tank 105 is again adjusted to the desired value in the preparation tank 105, and this alkali type developer is again fed into the leveling tank 108 via the piping 113.

For example, a range in which the concentration of the alkali type developer is controlled to within $\pm \frac{1}{1000}$ of the specified concentration is required as the control range of the concentration of the alkali type developer. Especially in the case of the abovementioned TMAH aqueous solution, values within $\pm \frac{1}{2000}$ of the specified concentration $(2.380\pm0.001$ wt %) tend to be required.

Alternatively, a concentration adjustment similar to that performed in the preparation tank 105 may be performed in the leveling tank 108. In concrete terms, the measurement signal from the alkali concentration measuring means 114 is sent out to the liquid supply control means 107, the error between the actually measured alkali concentration and the desired concentration is calculated on the basis of this measurement signal, and calculations are performed that calculate the amount of developer stock solution and/or pure water that is to be supplied to the preparation tank 105. Next, on the basis of a signal that indicates the results of these calculations, specified flow rate control valves are opened for a fixed time at a specified degree of opening. As a result, a specified amount of developer stock solution or pure water (or both) is supplied to the leveling tank 108, and the alkali concentration is evened out.

As a result, even if the function of the preparation tank 105 suffers from some kind of trouble so that a state that might cause a loss of this function is generated, a concentration adjustment similar to that of the preparation tank 105 can be performed in the leveling tank 108.

Furthermore, it is desirable that agitating means (second agitating means) similar to the agitating means 126 also be installed in the leveling tank 108. If this is done, the alkali concentration of the alkali type developer in the leveling tank 108 can be evened out more quickly. In regard to the method used to agitate the alkali type developer, a method similar to that used for the mixed solution inside the abovementioned preparation tank 105, i.e., agitation by means of agitating vanes, circulation type agitation in which the alkali type developer inside the leveling tank 108 is caused to reflux, or jet stream rotation type agitation in which the discharge direction of the nozzle 127 used to discharge the circulating solution into the leveling tank 108 again during circulation type agitation is disposed so that a force that causes the alkali type developer to rotate in the direction of the inner circumference of the leveling tank 108 can be applied, may be used. These methods may be appropriately selected and used; considering the generation of bubbles and the like in the alkali type developer, it is desirable to use circulation type agitation or jet stream rotation type agitation.

Next, the alkali type developer whose alkali concentration has been evened out is caused to flow through the piping 118. During this flow, particles are sufficiently removed from the alkali type developer by the filter 129, and this removal is monitored by the particle number measuring means 119 so that the particle concentration shows an appropriate value. Then, after the gases contained in the alkali type developer have been removed by the solute gas removal means 125, the alkali type developer is fed into the working equipment as a purified developer. In this case, furthermore, considering the evening out of the alkali concentration in the leveling tank 108, circulation and filtration are desirable.

When the alkali type developer is thus fed into the working equipment, the amount of liquid in the leveling tank 108 is reduced. In order to replenish the amount by which the alkali type developer is reduced and maintain the amount of liquid in the leveling tank 108 at a substantially constant amount, an alkali type developer with a newly prepared alkali concentration is fed into the leveling tank 108 from the preparation tank 105 via the piping 113. As a result, the liquid surface levels in the preparation tank 105 and leveling tank 108 are maintained at substantially fixed levels. In other words, the piping 113 can function as liquid feed/liquid surface level control means.

Here, for example, in cases where the alkali type developer is prepared by a batch system in the preparation tank 105, means that forcibly feed the liquid, such as a pump (not shown in the figures), may be installed in the piping 113 that feeds the alkali type developer into the leveling tank 108 from the preparation tank 105 as the abovementioned liquid feed/liquid surface level control means.

On the other hand, in cases where the alkali type developer is prepared by a continuous system in the preparation tank 105, piping which has means that forcibly feed the liquid (such as a pump or the like) in the same manner as in the case of the abovementioned batch system, or communicating piping that naturally feeds the alkali type developer into the leveling tank 108 form the preparation tank 105, may be used.

Here, the term "communicating piping" refers to piping that simply communicates between the preparation tank 105 and the leveling tank 108, without being equipped with mechanical means such as a pump or the like. In this sense, the piping 113 shown in the figures constitutes communicating piping as the liquid feed/liquid surface level control means.

If such communicating piping is used, then the alkali type developer inside the preparation tank 105 is naturally fed into the leveling tank 108 as a result of the hydraulic pressure difference between the preparation tank 105 and leveling tank 108 when the amount of alkali type developer inside the leveling tank 108 is reduced, so that the liquid levels in the preparation tank 105 and leveling tank 108 are maintained at substantially constant levels.

Furthermore, it is desirable to use such communicating piping in cases where it may be predicted that problems such as the generation of bubbles caused by disturbance of the liquid flow and the admixture of foreign matter such as dust generated by the driving of the pump or the like will occur if the alkali type developer is forcibly fed into the leveling tank 108 from the preparation tank 105 using a pump or the like.

Concentration control of the type described above with extremely strict requirements can be sufficiently realized using the purified developer producing equipment 100 constructed as described above, and the abovementioned purified developer producing method using this equipment. Furthermore, since calculation/control for the purpose of concentration adjustment is accomplished by automatic control performed by the control system, there is little time loss, and quick concentration adjustment of the alkali type developer is possible.

Furthermore, since adjustment of the concentration is performed in the abovementioned preparation tank 105 and leveling tank 108, an alkali type developer with the required concentration can be produced quickly and with greater precision than in conventional techniques, on the use side where the working equipment is installed.

Moreover, since deterioration in the liquidity of the developer stock solution and alkali type developer during preparation, as well as fluctuations in the alkali concentration, can be prevented, and since the alkali type developer whose alkali concentration has been evened out is fed into the working equipment via the piping 118 in a state in which this alkali type developer is sealed off from the atmosphere, an alkali type developer that is in an extremely good state of control can be supplied as required.

Figure 2:
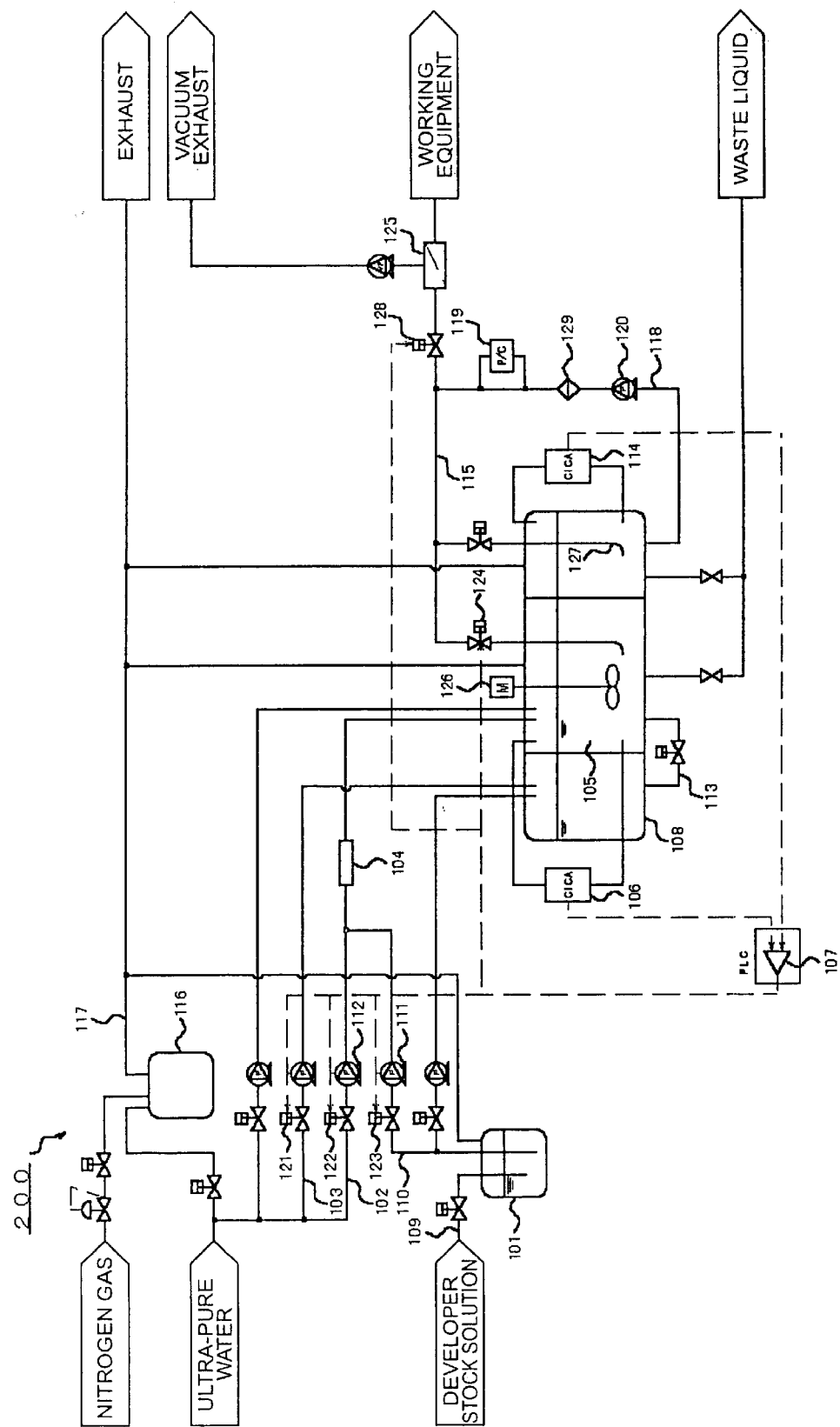
FIG. 2 is a system diagram which shows the construction of a second embodiment of the developer producing equipment of the present invention in model form.
Figure 3:
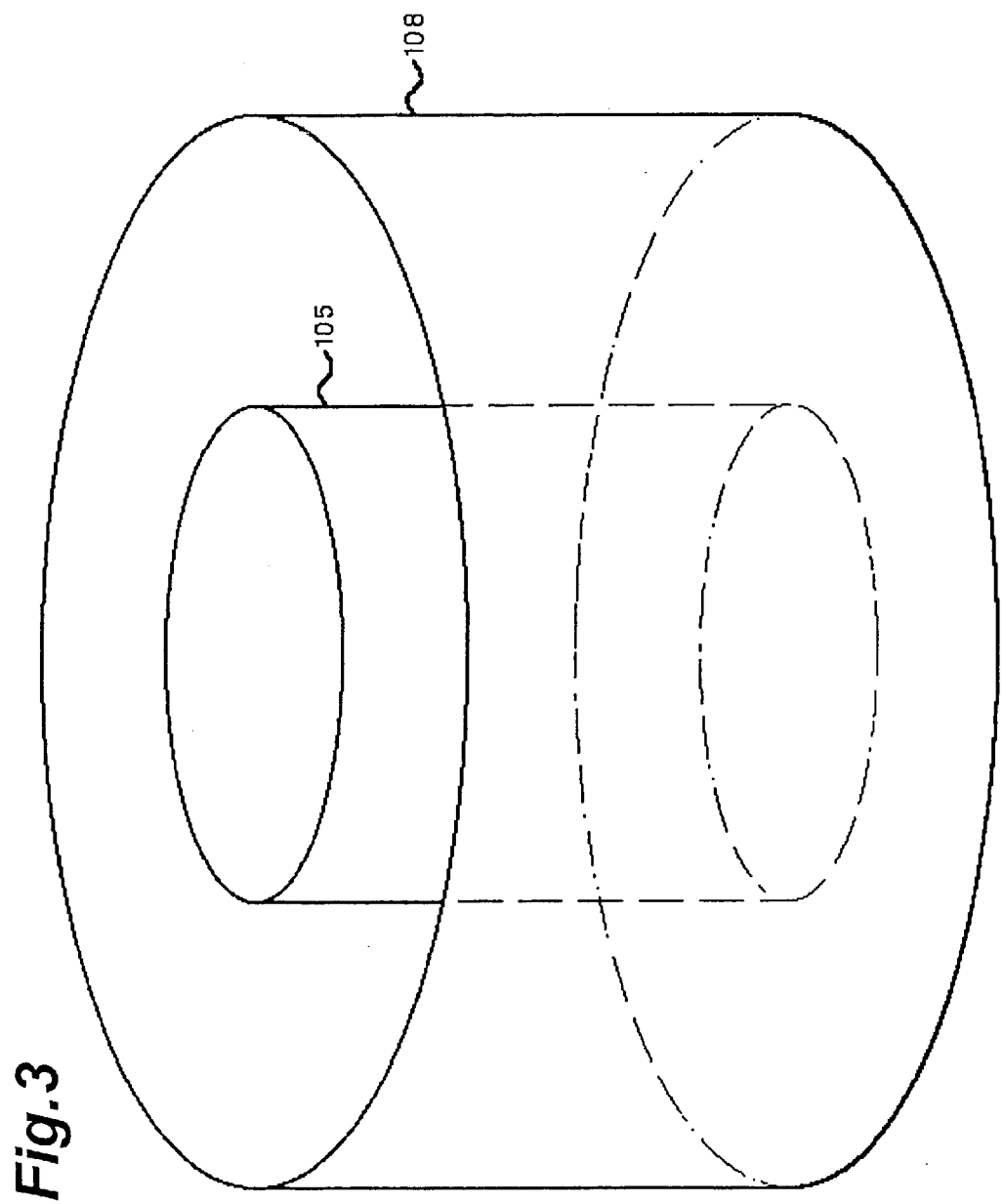
FIG. 3 is a perspective view which shows in model form the external appearance of the integrated preparation tank and leveling tank shown in FIG. 2.

As was described above, FIG. 2 is a system diagram which shows the construction of a second embodiment of the purified developer producing equipment of the present invention in model form. Except for the fact that the preparation tank 105 and leveling tank 108 are constructed as an integral unit, this purified developer producing equipment 200 is constructed so that the equipment has the same functions as the purified developer producing equipment 100 shown in FIG. 1. Furthermore, as was described above, FIG. 3 is a perspective view showing the external shape of such an integrated preparation tank 105 and leveling tank 108 in model form. As is shown in this figure, both of these tanks have a cylindrical shape, and a so-called double cylinder structure is constructed in which the preparation tank 105 is disposed coaxially inside the leveling tank 108.

By using such an integral construction, it is possible to reduce the size of the purified developer producing equipment 200 which is an accessory to the working equipment without having any deleterious effect on the high degree of alkali type developer production and control functionality. Accordingly, a reduction in the overall size of the working equipment, for which there has been an especially increased demand in recent years, can be handled.

Furthermore, the present invention is not limited to the respective embodiments described above. For example, the purified developer producing equipment 100 or 200 may also be suitably equipped with a storage tank (not shown in the figures) that is disposed between the leveling tank 108 and the working equipment. Such a storage tank is used to store the alkali type developer that is fed from the leveling tank 108, and this storage tank is connected to the leveling tank 108 via piping that has liquid-feeding means such as a pump or the like, or via communicating piping of the type described above.

If such a storage tank is provided, the alkali concentration of the alkali type developer that has been evened out by the leveling tank 108 can be made much more uniform. Accordingly, the adjustment precision of the alkali concentration of the alkali type developer that is fed into the working equipment can be greatly improved. Furthermore, since the amount of prepared alkali type developer that is stored can be increased, a large increase in the amount of alkali type developer used in the working equipment for electronic circuits or the like can be handled immediately. In addition, the working equipment can be operated without stopping during maintenance of the preparation tank 105 and/or the leveling tank 108.

Furthermore, a plurality of preparation tanks 105 may also be installed. The alkali concentration of the alkali type developer prepared in the preparation tank 105 is controlled to an appropriate range by the alkali concentration measuring means 106; however, as was described above, some error is generated with respect to the desired concentration in each preparation.

On the other hand, if alkali type developers prepared in a plurality of preparation tanks 105 are fed into the leveling tank 108 at one time, the variation caused by error in the alkali concentrations generated in the respective preparation tanks 105 is canceled out in the leveling tank 108, so that a uniform alkali concentration can quickly be obtained. Furthermore, as a result of the provision of such multiple tanks, even if one of the plurality of preparation tank 105 becomes inoperable due to trouble, inspection or the like, the other preparation tanks 105 can be operated, so that the production of the alkali type developer can be continued without interruption.

As was described above, the purified developer producing equipment and purified developer producing method of the present invention make it possible to produce a developer of the desired concentration from a developer stock solution quickly and with extremely good precision on the use side where working equipment for electronic circuit boards or the like is located; furthermore, the composition and concentration of the developer that is produced can be controlled with extremely good precision. Moreover, an alkali type developer controlled with high precision in accordance with recent market requirements can be quickly supplied to the working equipment and production process.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. Purified developer producing equipment which is connected via piping to working equipment in which electronic circuits on which fine working is performed are formed, and which produces an alkali type developer used in said working equipment, said purified developer producing equipment comprising:

a preparation tank to which a developer stock solution and pure water are supplied, and in which these ingredients are agitated so that said alkali type developer is prepared;

first alkali concentration measuring means for measuring the alkali concentration of said alkali type developer inside said preparation tank;

liquid supply control means for adjusting at least either the amount of said developer stock solution that is supplied to said preparation tank or the amount of said pure water that is supplied to said preparation tank, on the basis of the measured value obtained by said first alkali concentration measuring means;

a leveling tank to which the alkali type developer is supplied from said preparation tank, and which evens out the alkali concentration of said alkali type developer; and liquid feed/liquid surface level control means for feeding said alkali type developer into said leveling tank from said preparation tank, thus adjusting the liquid surface level of said alkali type developer in said preparation tank and the liquid surface level of said alkali type developer in said leveling tank.

2. The purified developer producing equipment according to claim 1, wherein said liquid feed/liquid surface level control means have communicating piping through which said alkali type developer is naturally fed into said leveling tank from said preparation tank, and which is connected to said preparation tank and said leveling tank.

3. The purified developer producing equipment according to claim 1, wherein said leveling tank is equipped with second alkali concentration measuring means for measuring the alkali concentration of said alkali type developer inside said leveling tank.

4. The purified developer producing equipment according to claim 3, wherein said second alkali concentration measuring means is constituted by at least one type of device selected from among a conductivity meter, an ultrasonic concentration meter, a liquid density meter and an automatic titration device.

5. The purified developer producing equipment according to claim 1, wherein said leveling tank is equipped with an agitating mechanism that agitates said alkali type developer inside said leveling tank.

6. The purified developer producing equipment according to claim 1, wherein said leveling tank is equipped with a filtration mechanism that filters said alkali type developer inside said leveling tank.

7. The purified developer producing equipment according to claim 1, further comprising circulation feeding piping which feeds said alkali type developer in said leveling tank into said preparation tank.

8. The purified developer producing equipment according to claim 1, further comprising a storage tank which is disposed between said leveling tank and said working equipment, and in which said alkali type developer is stored.

9. The purified developer producing equipment according to claim 1, wherein a plurality of said preparation tanks are provided.

10. The purified developer producing equipment according to claim 1, wherein said preparation tank and said leveling tank are constructed as an integral unit.

11. The purified developer producing equipment according to claim 1, further comprising wet nitrogen sealing means for sealing said preparation tank and said leveling tank with wet nitrogen gas.

12. The purified developer producing equipment according to claim 1, further comprising solute gas removal means for removing solute gas contained in said alkali type developer.

13. The purified developer producing equipment according to claim 1, further comprising particle number measuring means for measuring the number of particles contained in said alkali type developer in a state prior to the supply of said alkali type developer to said working equipment.

14. The purified developer producing equipment according to claim 1, wherein said first alkali concentration measuring means is constituted by at least one type of device selected from among a conductivity meter, an ultrasonic concentration meter, a liquid density meter and an automatic titration device.

15. A method for producing an alkali type developer that is supplied via piping to a working process for forming electronic circuits on which fine working is performed, said method comprising the steps of:

preparing said alkali type developer by agitating a developer stock solution and pure water;

measuring the alkali concentration of said alkali type developer;

adjusting at least either the amount of said developer stock solution that is supplied to said step of preparing said alkali type developer, or the amount of pure water that is supplied to said step of preparing said alkali type developer, on the basis of the measured value of the alkali concentration of said alkali type developer;

evening out the alkali concentration of the alkali type developer obtained in said step of preparing said alkali type developer; and adjusting the liquid surface level of the alkali type developer in said step of preparing said alkali type developer, and the liquid surface level of the alkali type developer in said step of evening out the alkali concentration of said alkali type developer.

* * * * *

UNITED STATES PATENT AND TRADEMARK OFFICE
CERTIFICATE OF CORRECTION

PATENT NO. : 6,588,927 B2
DATED : July 8, 2003
INVENTOR(S) : Toshimoto Nakagawa et al.

It is certified that error appears in the above-identified patent and that said Letters Patent is hereby corrected as shown below:

<u>Title page,</u>
Item [73], please add the second and third assignees
-- Hirama Laboratories Co., Ltd., Kanagawa (JP)
  Nagase CMS Technology Co., Ltd., Tokyo (JP) --

Signed and Sealed this

Twenty-fifth Day of November, 2003

JAMES E. ROGAN
*Director of the United States Patent and Trademark Office*